(12) United States Patent
Sakamoto

(10) Patent No.: US 10,062,863 B2
(45) Date of Patent: Aug. 28, 2018

(54) DISPLAY DEVICE

(71) Applicant: Japan Display Inc., Tokyo (JP)

(72) Inventor: Shigeru Sakamoto, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/635,389

(22) Filed: Jun. 28, 2017

(65) Prior Publication Data

US 2018/0006267 A1    Jan. 4, 2018

(30) Foreign Application Priority Data

Jun. 30, 2016    (JP) .................. 2016-130267

(51) Int. Cl.
  *H01L 51/52*    (2006.01)
  *H01L 27/32*    (2006.01)
  *H01L 51/00*    (2006.01)

(52) U.S. Cl.
  CPC ........ *H01L 51/5246* (2013.01); *H01L 27/326* (2013.01); *H01L 27/3246* (2013.01); *H01L 27/3276* (2013.01); *H01L 51/0097* (2013.01)

(58) Field of Classification Search
  CPC ............. H01L 51/5246; H01L 51/0097; H01L 27/3246; H01L 27/326; H01L 27/3276
  USPC ......................................................... 257/40
  See application file for complete search history.

(56) References Cited

U.S. PATENT DOCUMENTS

| | | | |
|---|---|---|---|
| 2012/0205698 A1* | 8/2012 | Yamazaki | H01L 51/524 257/98 |
| 2013/0248867 A1* | 9/2013 | Kim | H01L 51/5253 257/59 |
| 2015/0097171 A1* | 4/2015 | Kim | H01L 27/3246 257/40 |

FOREIGN PATENT DOCUMENTS

JP    2016-046126 A1    4/2016

* cited by examiner

*Primary Examiner* — Moazzam Hossain
*Assistant Examiner* — Warren H Kilpatrick
(74) *Attorney, Agent, or Firm* — Typha IP LLC

(57) ABSTRACT

A display device includes a display region having a plurality of pixels, each of the plurality of pixels including a pixel electrode formed on an insulating surface, the plurality of pixels being arranged in a matrix shape, a bank covering an end of the pixel electrode, an organic layer including a light emitting layer covering respective light emitting regions on the pixel electrodes, an opposite electrode on the organic layer and the bank, and a first inorganic insulating layer on the opposite electrode, wherein each of the opposite electrode and the first inorganic insulating layer has a discontinuous region between the two adjacent light emitting regions.

6 Claims, 18 Drawing Sheets

DISPLAY DEVICE

CROSS REFERENCE TO RELATED APPLICATIONS

This application is based on and claims the benefit of priority from the prior Japanese Patent Application No. 2016-130267, filed on Jun. 30, 2016, the entire contents of which are incorporated herein by reference.

FIELD

The present invention relates to a display device.

BACKGROUND

Conventionally, an organic electroluminescence display device (organic EL display device) using an organic electroluminescence material (organic EL material) for a light emitting element (organic electroluminescence element) in a display section has been known as a display device. The organic EL display device is a so-called self-luminescent display device which implements display by causing the organic EL material to emit light, unlike a liquid crystal display device.

When the organic EL element included in the organic EL display device is exposed to the air, the performance of the element to deteriorate, since a light emitting layer including the organic EL material and a cathode are deteriorated by moisture and oxygen in the atmosphere. Thus, a sealing structure for blocking the organic EL element from the outside air has been examined. Japanese Patent Application Laid-Open No. 2016-046126, for example, discloses protecting an organic EL element from oxygen and moisture in the atmosphere by covering the organic EL element with a barrier layer including an inorganic film.

SUMMARY

According to an aspect of the present invention, there is provided a display device including a display region having a plurality of pixels, each of the plurality of pixels including a pixel electrode formed on an insulating surface, the plurality of pixels being arranged in a matrix shape, a bank covering an end of the pixel electrode, an organic layer including a light emitting layer covering respective light emitting regions on the pixel electrodes, an opposite electrode on the organic layer and the bank, and a first inorganic insulating layer on the opposite electrode, wherein each of the opposite electrode and the first inorganic insulating layer has a discontinuous region between the two adjacent light emitting regions.

DESCRIPTION OF EMBODIMENTS

Figure 1:
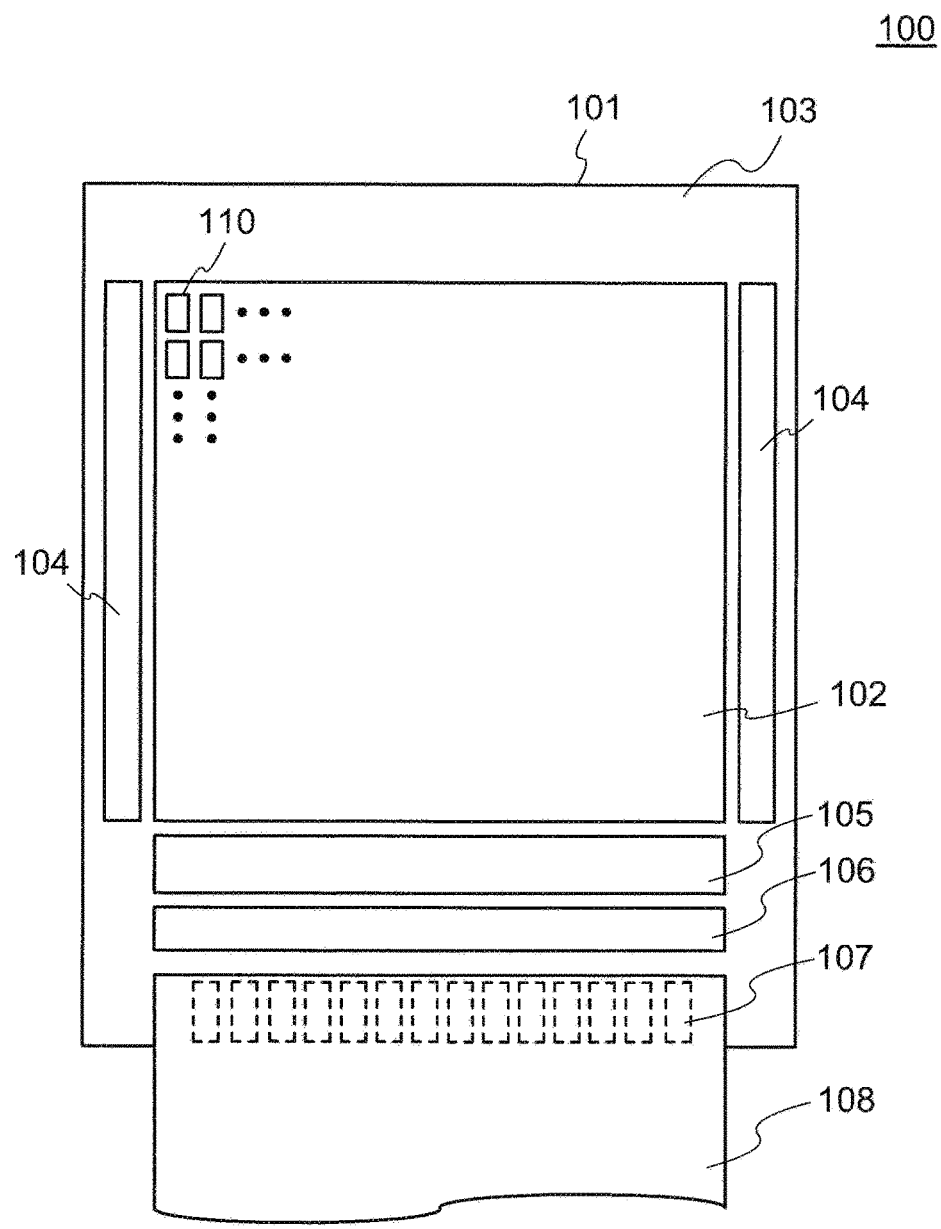
FIG. 1 is a schematic view illustrating a configuration of an organic EL display device according to an embodiment of the present invention.

An organic EL display device having a flexible display in which an organic EL element is provided on a flexible resin substrate such as plastic has been developed. However, when the flexible display is bended, an inorganic film provided as a barrier layer for blocking the organic EL element from the outside air may be broken. When the inorganic film serving as the barrier layer is broken, the organic EL element is deteriorated by moisture or oxygen entered from outside, and the reliability of the organic EL display device is impaired.

One object of the present invention is to provide an organic electroluminescence display device having high reliability by preventing an inorganic film covering an organic EL element from being broken.

In the following, each embodiment of the present invention is described with reference to the drawings. However, the present invention can be implemented in various modes in a range not deviating from the gist of the present invention, and should not be interpreted as being restricted to the contents of the description of the embodiments exemplarily described below. Also, in the drawings, for more clarification of description, the width, thickness, shape, and others of each component may be schematically represented compared with actual modes. However, each of these schematic drawings is merely an example, and does not restrict interpretation of the present invention. Furthermore, in the specification and each drawing, a component identical to or similar to one described in a previously-described drawing is provided with the same reference character, and description of this component may be omitted.

In the present invention, when one film is processed to form a plurality of films, each of the plurality of these films may have different functions and roles. However, the plurality of these films are derived from a film formed in the same process and as the same layer, and have the same layer structure and the same material. Therefore, the plurality of these films are defined as being present on the same layer.

Note in the specification that representations such as "on", "above", "under" and "below" when drawings are described represent a relative positional relation between a structure of interest and another structure. In the specification, in a side view, a direction from an insulating surface to a semiconductor layer, which will be described further below, is defined as "upper", and a direction opposite thereto is defined as "lower". In the specification and claims, when a mode represented as "a structure is arranged on another structure" includes both of a case in which a structure is directly arranged on another structure so as to be in contact with another structure and a case in which a structure is arranged on another structure via still another structure, unless otherwise specified.

Also, in the specification, a "display device" refers to a device which displays an image by using a liquid-crystal layer or a light-emitting element such as an organic electroluminescence element. Therefore, the display device includes a display module (also referred to as a display panel) including a liquid-crystal layer or a light-emitting element such as an organic electroluminescence element and a display device having the display module in combination with another component (for example, a cover glass).

First Embodiment

FIG. 1 is a schematic view illustrating a configuration of an organic EL display device 100 according to an embodiment of the present invention. FIG. 1 illustrates a schematic configuration in a case where the organic EL display device 100 is viewed in a planar view. In the present specification, a view of the organic EL display device 100 from a direction perpendicular to a screen (a display region) is referred to as a "planar view".

As illustrated in FIG. 1, the organic EL display device 100 includes a display region 102, a peripheral region 103 positioned around the display region 102, a scanning line driving circuit 104, a data line driving circuit 105, and a driver integrated circuit (IC) 106 which are formed on an insulating surface. The driver IC 106 functions as a control section for supplying a signal to the scanning line driving circuit 104 and the data line driving circuit 105. The data line driving circuit 105 may be included in the driver IC 106. The data line driving circuit 105 may be incorporated into the driver IC 106. The driver IC 106 may be separately arranged on the substrate 101 in a form like an IC chip, or may be provided in and externally mounted on a flexible print circuit (FPC) 108. The FPC 108 is connected to a terminal 107 provided in the peripheral region 103.

An insulating surface is a surface of the substrate 101. The substrate 101 supports a pixel electrode and layers such as an insulating layer which are provided on the surface. The substrate 101 itself is composed of an insulating material, and may have the insulating surface, or an insulating film may be separately formed on the substrate 101 to form the insulating surface. As long as the substrate 101 has an insulating surface, the quality of a material for the substrate 101 and a material forming the insulating film are not particularly limited.

A plurality of pixels 110 are arranged in a matrix shape in the display region 102 illustrated in FIG. 1. Each of the pixels 110 includes a pixel electrode, described below, and a light emitting element including a part of the pixel electrode (an anode), an organic layer (a light emitting section) including a light emitting layer stacked on the pixel electrode, and a cathode. A data signal corresponding to image data is supplied to each of the pixels 110 from the data line driving circuit 105. A transistor electrically connected to the pixel electrode provided at each of the pixels 110 is driven in response to the data signal so that a display corresponding to the image data can be displayed. As the transistor, a thin film transistor (TFT) can be typically used. However, the transistor is not limited to the thin film transistor. Any element may be used if it has a current control function.

Figure 2:
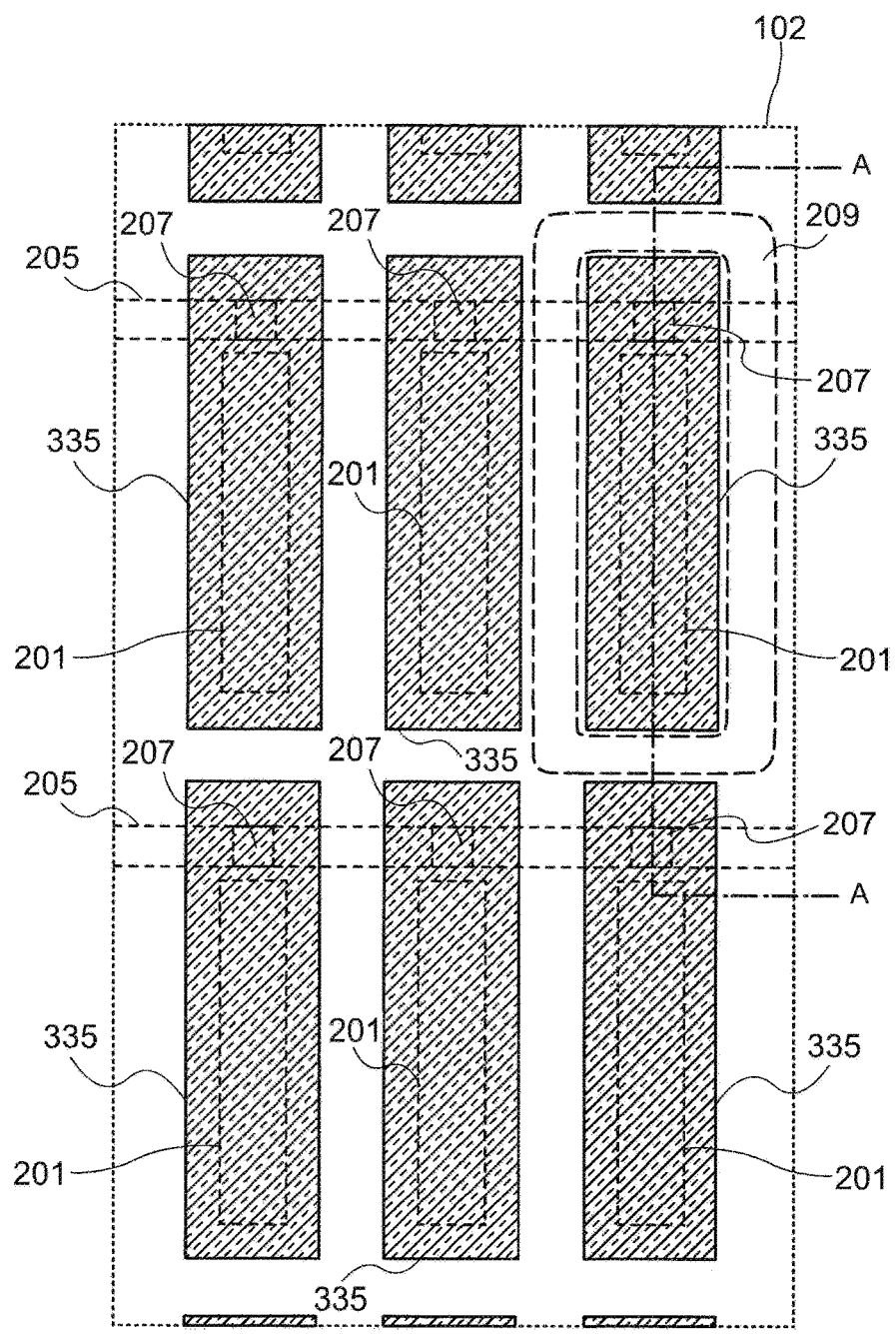
FIG. 2 is a diagram illustrating an example of a configuration of a display region in the organic EL display device.

FIG. 2 is a diagram illustrating a configuration of the display region 102 in the organic EL display device 100 according to the first embodiment. More specifically, FIG. 2 illustrates a configuration in which six light emitting elements 201 are viewed in a planar view as a part of the display region 102. While the six light emitting elements 201 are illustrated in FIG. 2, not less than several million light emitting elements are actually arranged in a matrix shape to respectively correspond to the pixels 110 in the display region 102.

As described above, each of the pixels 110 includes a pixel electrode, and a light emitting element 201 including a part of the pixel electrode (an anode), an organic layer (a light emitting section) stacked on the pixel electrode and including a light emitting layer containing an organic EL material, and an opposite electrode (a cathode) provided on the organic layer. The light emitting element 201 is provided in a light emitting region. The light emitting region means a part of a pixel electrode exposed from a second insulating layer (bank), described below, in a planar view. The second insulating layer (bank) covers an end of the pixel electrode, and is provided between the adjacent pixel electrodes. A fourth insulating layer (first inorganic insulating layer) 335 is provided on the opposite electrode. The opposite electrode is electrically connected to a wiring 205 provided in a layer below the second insulating layer (bank). FIG. 2 illustrates a portion where the opposite electrode and the wiring 205 are connected to each other as a connection section 207. In FIG. 2, description of components other than the light emitting element 201, the fourth insulating layer 335, the wiring 205, and the connection section 207 is omitted.

The organic EL display device 100 includes a discontinuous region 209 in which at least the opposite electrode and the fourth insulating layer 335 are respectively divided between two light emitting regions adjacent to each other in the display region 102. The discontinuous region 209 is provided to surround at least one of the light emitting elements 201 in a planar view. As illustrated in FIG. 2, the discontinuous region 209 is provided to surround the one light emitting element 201 in a planar view in the present embodiment.

While an example in which a stripe array of pixels is used as a pixel array has been illustrated in the present embodiment, the pixel array may be a delta array, a Bayer array, and an array implementing a PenTile structure in addition thereto.

Figure 3:
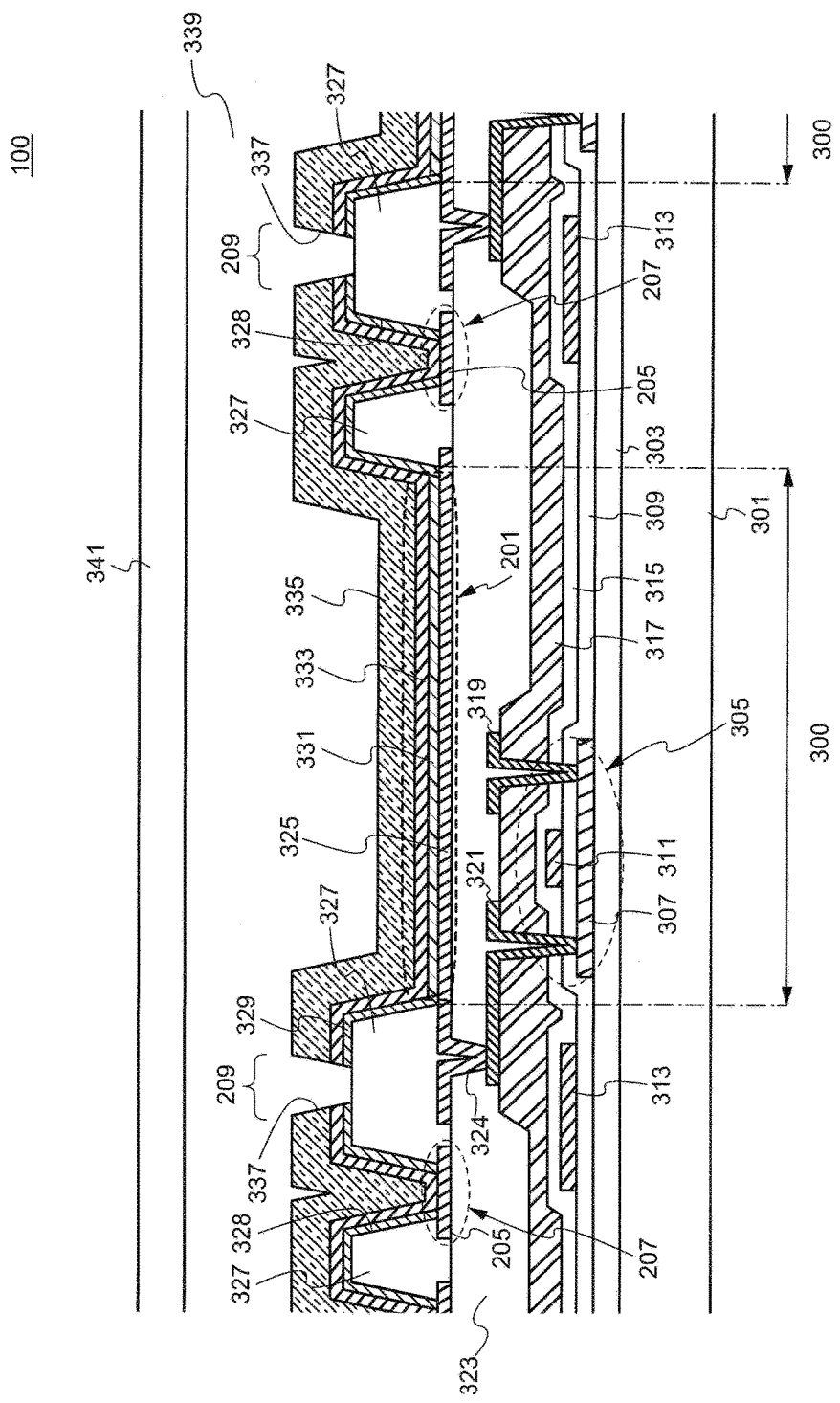
FIG. 3 is a cross-sectional view along a line A-A in FIG. 2.

FIG. 3 is a diagram illustrating an example of a configuration of the pixel in the organic EL display device 100 according to the first embodiment. More specifically, FIG. 3 illustrates a configuration of a cross section, cut along a line A-A, of the display region 102 illustrated in FIG. 2. The organic EL display device 100 according to the present embodiment will be specifically described with reference to FIG. 3. As illustrated in FIG. 3, the organic EL display device 100 includes a substrate 301. Examples of the substrate 301 can include a glass substrate, a quartz substrate, and a flexible substrate (a resin substrate having flexibility such as polyimide, polyethylene terephthalate, or polyethylene naphthalate). If the substrate 301 need not have a translucent property, a metal substrate, a ceramic substrate, or a semiconductor substrate can also be used. Particularly when the flexible substrate is used, an underlying layer having a stacked structure, as described below, is desirably provided to enhance a protective function from outside.

An underlying layer 303 is provided on the substrate 301. The underlying layer 303 is an insulating layer composed of an inorganic material such as silicon oxide, silicon nitride, or aluminum oxide. The underlying layer 303 is not limited to a single layer, but may have a stacked structure of a silicon oxide layer and a silicon nitride layer, for example. This configuration may be determined, as needed, in consideration of an adhesion property to the substrate 301 and a gas barrier property against a thin film transistor 305, described below.

The thin film transistor 305 is provided on the underlying layer 303. A structure of the thin film transistor 305 may be of a top gate type or a bottom gate type. In the present embodiment, the thin film transistor 305 includes a semiconductor layer 307 provided on the underlying layer 303, a gate insulating film 309 covering the semiconductor layer 307, a gate electrode 311 provided on the gate insulating film 309, interlayer insulating films 315 and 317 covering the gate electrode 311, and a source electrode 319 and a drain electrode 321 provided on the interlayer insulating film 317 and each connected to the semiconductor layer 307. While an example in which the interlayer insulating film has a stacked structure of the interlayer insulating films 315 and 317 has been described in the present embodiment, the interlayer insulating film may be a single layer.

A material for each of the layers constituting the thin film transistor 305 may be a known material, and is not particularly limited. For example, as the semiconductor layer 307, polycrystalline silicon (polysilicon), amorphous silicon, or an oxide semiconductor can be generally used. As the gate insulating film 309, silicon oxide or silicon nitride can be used. The gate electrode 311 includes a metal material such as copper, molybdenum, tantalum, tungsten, or aluminum. As the interlayer insulating films 315 and 317, silicon oxide or silicon nitride can be used. Each of the source electrode 319 and the drain electrode 321 includes a metal material such as copper, titanium, molybdenum, or aluminum.

A wiring 313 includes the same metal material as the metal material composing the gate electrode 311 can be provided in the same layer as that provided with the gate electrode 311. For example, the wiring 313 can be provided as a scanning line driven by the scanning line driving circuit 104, or the like. A wiring extending in a direction intersecting the wiring 313 can be provided in the same layer as that provided with the source electrode 319 and the drain electrode 321, which is not illustrated in FIG. 3. The wiring can be provided as a signal line driven by the data line driving circuit 105, for example.

A first insulating layer 323 is provided on the thin film transistor 305. The first insulating layer 323 functions as a flattening film. The first insulating layer 323 includes an organic resin material. Examples of the organic resin material can include known organic resin materials such as polyimide, polyamide, acrylic, and epoxy. The materials can be film-formed by a solution application method, and have a high flattening effect. The first insulating layer 323 is not limited to a single layer structure, but may have a stacked structure of a layer including an organic resin material and an inorganic insulating layer, which is not particularly shown.

The first insulating layer 323 includes a contact hole 324 which exposes a part of the source electrode 319 or the drain electrode 321. The contact hole 324 is an opening for electrically connecting a pixel electrode 325, described below, and the source electrode 319 or the drain electrode 321 to each other. Therefore, the contact hole 324 is overlapped the part of the source electrode 319 or the drain electrode 321. The source electrode 319 or the drain electrode 321 is exposed at a bottom of the contact hole 324.

The pixel electrode 325 is provided on the first insulating layer 323. The pixel electrode 325 overlaps the contact hole 324, and is electrically connected to the source electrode 319 or the drain electrode 321 exposed at the bottom of the contact hole 324. In the organic EL display device 100 according to the present embodiment, the pixel electrode 325 functions as an anode constituting the light emitting element 201. The pixel electrode 325 has different constitutions depending on whether it is of a top emission type or a bottom emission type. In the case of a top emission type, for example, a metal film having a high reflectivity or a stacked structure of a transparent conductive film having a high work function such as an indium oxide-based transparent conductive film (e.g., indium tin oxide (ITO)), and a zinc oxide-based transparent conductive film (e.g., indium zinc oxide (IZO) or zinc oxide (ZnO)), and a metal film is used as the pixel electrode 325. On the other hand, in the case of a bottom emission type, the aforementioned transparent conductive film is used as the pixel electrode 325. In the present embodiment, an organic EL display device of a top emission type will be described as an example. An end of the pixel electrode 325 is covered with a second insulating layer 327, described below.

In the present embodiment, a wiring 205 electrically independent of the pixel electrode 325 is provided between the adjacent pixel electrodes 325 on the first insulating layer 323. The wiring 205 is provided in the same layer as that provided with the pixel electrode 325, and can be composed of the same material as that composing the pixel electrode 325. The wiring 205 is electrically connected to an opposite electrode 333, described below. The wiring 205 extends to the outside of a display region, and is connected to the terminal 107 illustrated in FIG. 1, which is not particularly illustrated. While the wiring 205 is provided in the same layer as that provided with the pixel electrode 325 in the present embodiment, a position of the wiring 205 is not limited to this. The wiring 205 may be provided in a layer below a second insulating layer (bank) 327, described below. The wiring 205 may be provided at a different site from that illustrated in FIG. 3 depending on a position of the discontinuous region 209, described below.

The second insulating layer 327 including of an organic resin material is provided on the pixel electrode 325. A known polyimide-, polyamide-, acrylic-, epoxy-, or siloxane-based resin material can be used as the organic resin material. The second insulating layer 327 has an opening in its part on the pixel electrode 325. The second insulating layer 327 is provided to cover an end (edge portion) of the pixel electrode 325 between the pixel electrodes 325 adjacent to each other, and functions as a member for separating the adjacent pixel electrodes 325. Thus, the second insulating layer 327 is also generally referred to as a "partition" or a "bank". A part of the pixel electrode 325 exposed from the second insulating layer 327 is a light emitting region 300. The opening of the second insulating layer 327 has its inner wall preferably formed in a tapered shape. Thus, at the time of formation of the light emitting layer, described below, defective coverage at the end of the pixel electrode 325 can be reduced. The second insulating layer 327 may not only cover the end of the pixel electrode 325 but also function as a filling material for filling a recess caused by the contact hole 324.

In the present embodiment, a contact hole 328 for electrically connecting the wiring 205 and the opposite electrode 333, described below, to each other is provided in the second insulating layer 327, as illustrated in FIG. 3. If the wiring 205 is provided outside the display region 102, the contact hole 328 can be omitted.

A third insulating layer (second inorganic insulating layer) 329 covering the second insulating layer 327 is provided on the second insulating layer 327. The third insulating layer 329 is composed of an inorganic material such as silicon oxide or silicon nitride. The third insulating layer 329 has an opening in the light emitting region 300. The third insulating layer 329 has an opening for exposing the wiring 205 in the contact hole 328.

Figure 4:
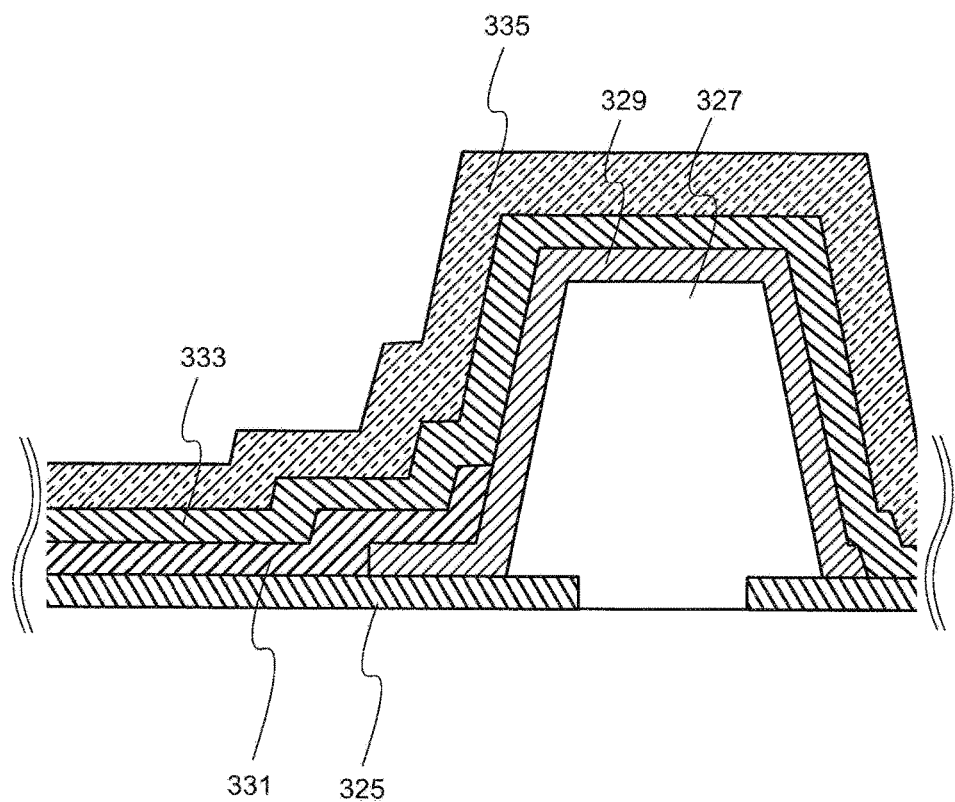
FIG. 4 is a partially enlarged view of FIG. 3.

FIG. 4 is an enlarged view in the vicinity of a contact section between the pixel electrode 325 and the second insulating layer 327 in FIG. 3. The third insulating layer 329 functions as a barrier layer which prevents gas or water generated from an organic resin material composing the second insulating layer 327 from entering an organic layer 331, described below. Thus, the third insulating layer 329 contacts the pixel electrode 325 around the second insulating layer 327 so that the second insulating layer 327 and the organic layer 331 do not contact each other, as illustrated in FIG. 4.

The third insulating layer 329 is not an essential component in the organic EL display device 100 but can also be omitted.

An organic layer 331 is provided on the pixel electrode 325. The organic layer 331 has at least a light emitting layer containing an organic material, and functions as a light emitting section of the light emitting element 201. The organic layer 331 can also include various types of charge transport layers such as an electron injection layer, electron transport layer, a hole injection layer, and a hole transport layer in addition to the light emitting layer. The organic layer 331 is provided to cover the light emitting region 300, i.e., to cover the opening provided in the second insulating layer 327 and the third insulating layer 329 in the light emitting region 300.

In the present embodiment, a light emitting layer, which emits light in a desired color, is provided in the organic layer 331, and the organic layer 331 having a different light emitting layer is formed on each of the pixel electrodes 325, to display colors R, G, and B. That is, in the present embodiment, the organic layer 331 is discontinuous between the adjacent pixel electrodes 325. A known structure and a known material can be used for the organic layer 331, and the present invention is not particularly limited to a configuration according to the present embodiment. The organic layer 331 has a light emitting layer which emits white light, and the colors R, G, and B may be displayed via a color filter. In this case, the organic layer 331 may also be provided on the third insulating layer 329.

The opposite electrode 333 is provided on the organic layer 331 and the third insulating layer 329. The opposite electrode 333 functions as a cathode constituting the light emitting element 201. The organic EL display device 100 according to the present embodiment is of a top emission type. Thus, a transparent electrode is used as the opposite electrode 333. As a thin film composing the transparent electrode, a MgAg thin film or a transparent conductive film (ITO or IZO) is used. The opposite electrode 333 is also provided on the third insulating layer 329 to extend over the pixels 201. The opposite electrode 333 is electrically connected to an external terminal via a lower conductive layer in a peripheral region in the vicinity of an end of the display region 102. As described above, in the present embodiment, a part of the pixel electrode 325 (the anode) exposed from the second insulating layer 327, the organic layer 331 (the light emitting section), and the opposite electrode 333 (the cathode) constitute the light emitting element 201.

The opposite electrode 333 is electrically connected to the wiring 205 via the contact hole 328. More specifically, the opposite electrode 333 is connected to the wiring 205 exposed in the contact hole 328. A connection section between the opposite electrode 333 and the wiring 205 corresponds to the connection section 207 illustrated in FIG. 2. The opposite electrode 333 is supplied with a voltage at a predetermined potential from the wiring 205.

A fourth insulating layer (first inorganic insulating layer) 335 is provided on the opposite electrode 333. The fourth insulating layer 335 functions as a barrier layer for protecting the organic EL element from external moisture or the outside air, and includes an inorganic material. A highly dense inorganic insulating film such as a silicon nitride film is preferably used as the fourth insulating layer 335. The fourth insulating layer 335 corresponds to an insulating layer 203 illustrated in FIG. 2.

The substrate 301 to the fourth insulating layer 335, described above, are collectively referred to as an array substrate in the present embodiment.

The organic EL display device 100 according to the present embodiment includes the discontinuous region 209 in which the third insulating layer 329, the opposite electrode 333, and the fourth insulating layer 335 are respectively divided between the adjacent light emitting regions 300. More specifically, as illustrated in FIG. 3, on the second insulating layer 327 functioning as a bank for separating the two adjacent light emitting regions 300, i.e., the adjacent pixel electrodes 325, the third insulating layer 329, the opposite electrode 333, and the fourth insulating layer 335 are provided with an opening 337. The second insulating layer 327 is exposed at a bottom of the opening 337. The opening 337 corresponds to the discontinuous region 209 where the third insulating layer 329, the opposite electrode 333 and the fourth insulating layer 335 are respectively divided. In other words, the opening 337 is a slit provided in the third insulating layer 329, the opposite electrode 333, and the fourth insulating layer 335. The opening 337 functions as a stress relaxation section for relaxing a stress applied to the third insulating layer 329 and the fourth insulating layer 335 each composed of an inorganic material when the stress is applied to an array substrate by the organic EL display device 100 being bent, for example, and can prevent the third insulating layer 329 and the fourth insulating layer 335 from being broken.

When the third insulating layer 329 is omitted in the organic EL display device 100, the opening 337 is provided in the opposite electrode 333 and the fourth insulating layer 335. In this case, the opposite electrode 333 and the fourth insulating layer 335 are discontinuous between the two adjacent light emitting regions 300. A discontinuous region in which the opposite electrode 333 and the fourth insulating layer 335 are respectively divided functions as a stress relaxation section which relaxes a stress applied to the fourth insulating layer 335 composed of an inorganic material, and prevents the fourth insulating layer 335 from being broken.

An opposite substrate 341 is provided on the array substrate via a filling material (fill material) 339 functioning as an adhesive material and a protective material. A known polyimide-, polyamide-, acrylic-, epoxy-, or siloxane-based resin material can be used as the filling material 339. The filling material 339 fills the opening 337 provided in the third insulating layer 329, the opposite electrode 333, and the fourth insulating layer 335. The filling material 339 may be provided with a spacer to ensure a gap between the array substrate and the opposite substrate 341. The spacer may be mixed with the filling material 339 or may be formed of resin or the like on the array substrate. When the peripheral portion of the substrate is sufficiently sealed and the gap between the array substrate and the opposite substrate 341 can be maintained, hollow sealing can be implemented without using the filling material 339.

The opposite substrate 341 may be provided with an overcoat layer to also serve as a flattening film, for example. If the organic layer 331 emits white light, the opposite substrate 341 may be provided with color filters respectively corresponding to the colors R, G, and B on a main surface (a surface opposing the substrate 301) and black masks respectively provided among the color filters. The opposite substrate 341 is not an essential element of the organic EL display device 100. When the filling material 339 has a sufficient film thickness and strength, and layers below the fourth insulating layer 335 can be favorably protected from contact of a foreign material from outside, the opposite substrate 341 can be omitted. If the opposite substrate 341 is omitted while a color filter is required, the color filter may be directly formed on the fourth insulating layer 335, for example, and the filling material 339 may be formed thereon.

As described above, in the organic EL display device 100 according to the present embodiment, the third insulating layer 329, the opposite electrode 333, and the fourth insulating layer 335 are provided with the opening 337, and the discontinuous region 209 in which the third insulating layer 329, the opposite electrode 333, and the fourth insulating layer 335 are respectively divided is provided on the second insulating layer 327 functioning as a bank for separating the two adjacent light emitting regions 300, i.e., the adjacent pixel electrodes 325. The discontinuous region 209 prevents the third insulating layer 329 and the fourth insulating layer 335 each composed of an inorganic material from being broken when a stress is applied to the array substrate by the organic EL display device 100 being bent, for example. Thus, the reliability of the organic EL display device 100 can be improved.

(Manufacturing Method of Display Device)

Processes of manufacturing the array substrate of the organic EL display device 100 according to the present embodiment having the aforementioned configuration will be described below with reference to FIGS. 5 to 11.

Figure 5:
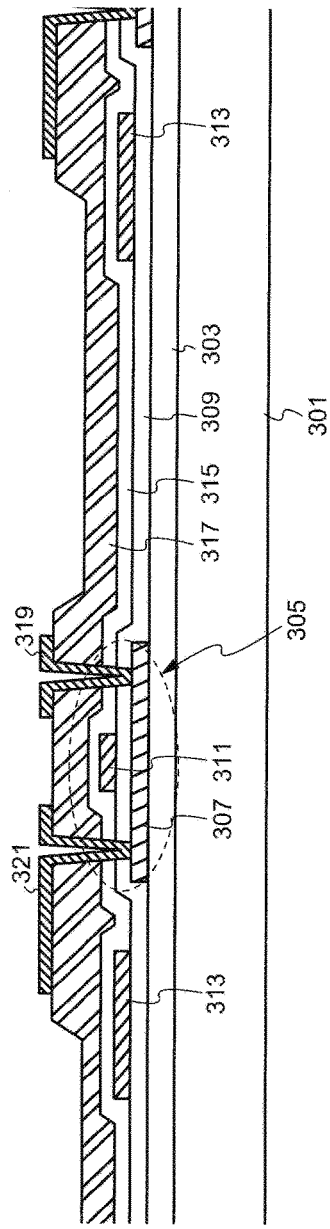
FIG. 5 is a diagram for illustrating processes for manufacturing the organic EL display device.

As illustrated in FIG. 5, an underlying layer 303 is formed on a substrate 301, and a thin film transistor (TFT) 305 is formed by a known method on the underlying layer 303. Example of the substrate 301 can include a glass substrate, a quartz substrate, and a flexible substrate (a substrate having flexibility composed of polyimide, polyethylene terephthalate, polyethylene naphthalate, or the like). When the substrate 301 need not have a translucent property, a metal substrate, a ceramic substrate, or a semiconductor substrate can also be used.

An insulating layer composed of silicon oxide or silicon nitride or a stacked film of the insulating films can be typically used as the underlying layer 303. The underlying layer 303 has a function of preventing entrance of a contaminant from the substrate 301 and relaxing a stress generated by expansion/contraction of the substrate 301.

The thin film transistor 305 may be formed by a known method, as described above. For example, the semiconductor layer 307 including polysilicon, amorphous silicon, or an oxide semiconductor is formed on the underlying layer 303, and a gate insulating film 309 including silicon oxide is formed to cover the semiconductor layer 307. A gate electrode 311 which includes a metal material such as copper, molybdenum, tantalum, tungsten, or aluminum is formed on the gate insulating film 309. A wiring 313 may be formed using the same material as that for the gate electrode 311 on the same layer as that provided with the gate electrode 311. Interlayer insulating films 315 and 317 are formed on the gate electrode 311 to cover the gate electrode 311. An insulating film composed of silicon oxide or silicon nitride can be used as the interlayer insulating films 315 and 317. Further, a contact hole reaching the semiconductor layer 307 is formed in the interlayer insulating films 315 and 317 and the gate insulating film 309, and a source electrode 319 and a drain electrode 321 each including a metal material such as copper, titanium, molybdenum, or aluminum are then formed. The interlayer insulating film 315 or 317 can be omitted. That is, the interlayer insulating film may be a single layer.

The thin film transistor 305 is formed by the foregoing processes. While an example in which a thin film transistor of a top gate type is formed as the thin film transistor 305 has been illustrated in the present embodiment, a thin film transistor of a bottom gate type may be formed by a known method.

Figure 6:
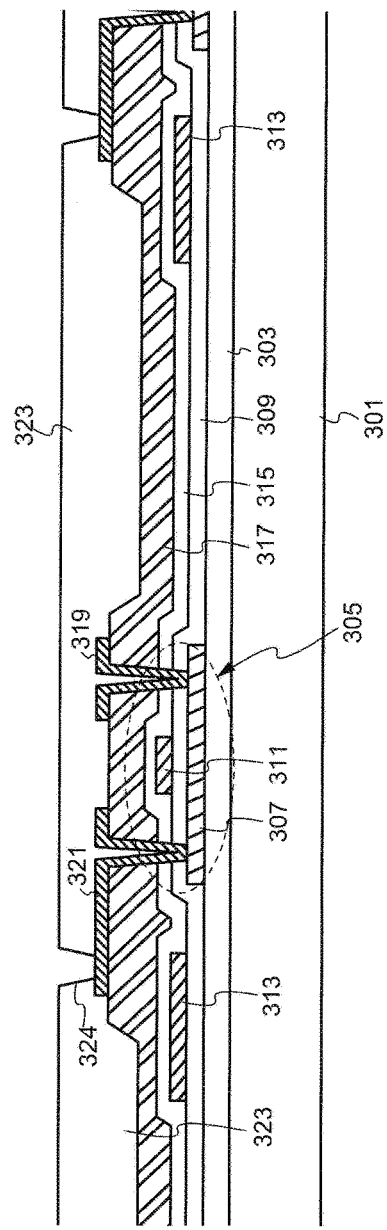
FIG. 6 is a diagram for illustrating processes for manufacturing the organic EL display device.

After the thin film transistor 305 is formed, a first insulating layer 323 is formed, and a contact hole 324 reaching the source electrode 319 or the drain electrode 321 is formed, as illustrated in FIG. 6. In the present embodiment, a resin layer composed of photosensitive acrylic resin is formed as the first insulating layer 323, and the contact hole 324 is formed by photolithography using a photomask. Since the first insulating layer 323 is used as a flattening film, the thickness thereof is preferably set to between 1 µm and 3 µm.

Figure 7:
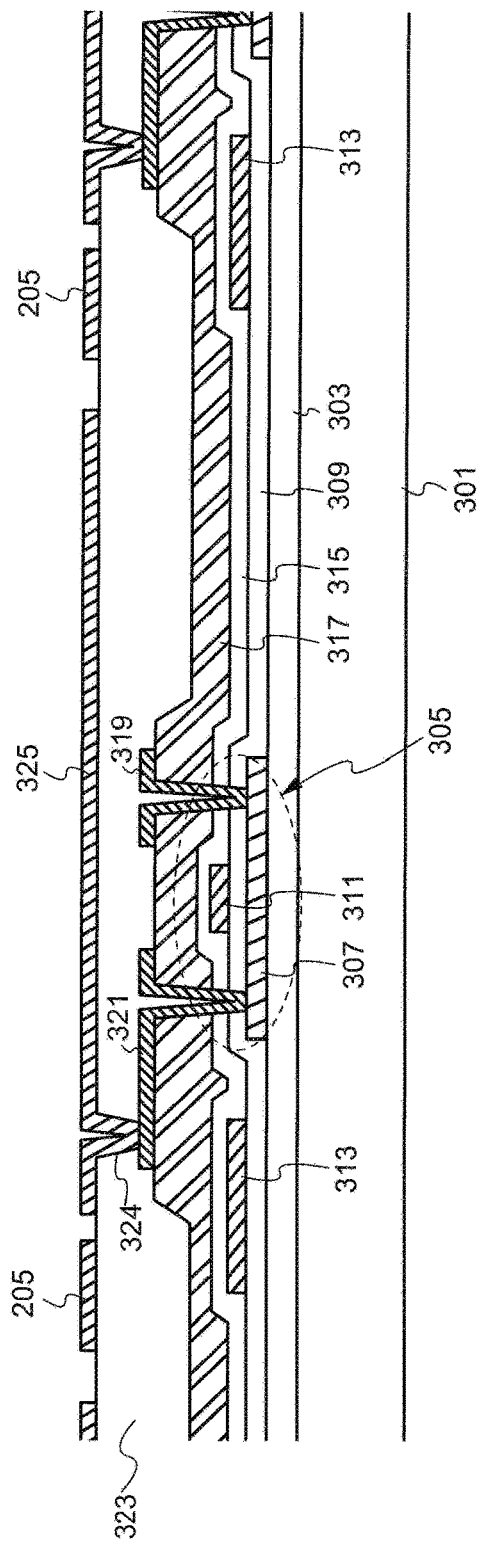
FIG. 7 is a diagram for illustrating processes for manufacturing the organic EL display device.

Then, a pixel electrode 325 is formed on the first insulating layer 323, as illustrated in FIG. 7. The pixel electrode 325 is formed to cover the contact hole 324. The pixel electrode 325 is formed by forming a conductive layer having a three-layer structure with a silver thin film sandwiched between ITO thin films and patterning the conductive layer, for example. Since a configuration in which light is extracted upward (toward a direction far away from the substrate 301) from the display device is used in the present embodiment, the sliver thin film is used as a reflection layer. The pixel electrode 325 thus formed functions as an anode in the light emitting element 201 in the present embodiment. A wiring 205 is also formed, like the pixel electrode 325.

Figure 8:
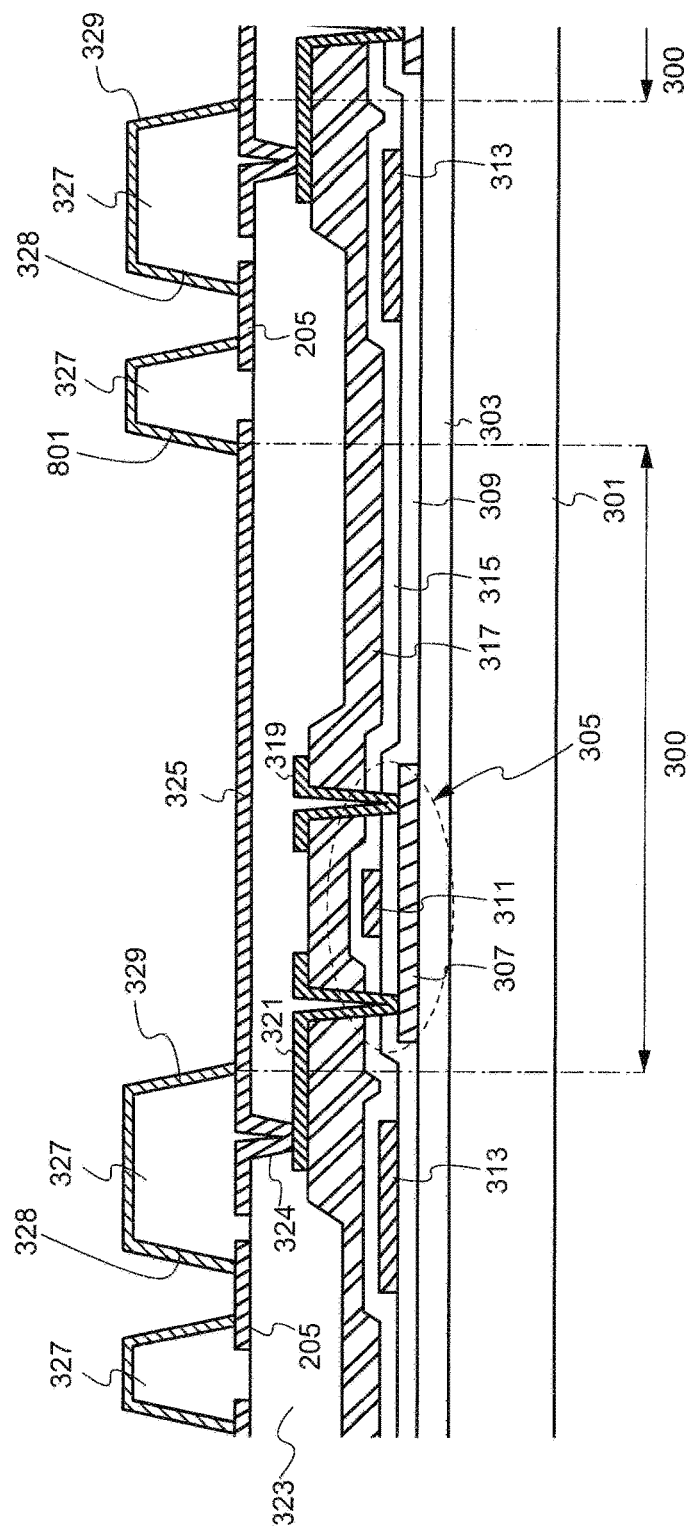
FIG. 8 is a diagram for illustrating processes for manufacturing the organic EL display device.

Then, as illustrated in FIG. 8, a second insulating layer 327 functioning as a bank separating the adjacent pixel electrodes 325 to separate adjacent light emitting regions 300 is formed. The second insulating layer 327 can be obtained by forming a resin layer having a film thickness of approximately 1 µm on the pixel electrode 325, then forming an opening 801 in the resin layer to expose a part of the pixel electrode 325 in a region overlapping the part of the pixel electrode 325, and further forming a contact hole 328 in a region overlapping a part of the wiring 205 to expose the part of the wiring 205. The part of the pixel electrode 325 exposed by the opening 801 corresponds to the light emitting region 300.

After the second insulating layer 327 is formed, a third insulating layer 329 is formed. The third insulating layer 329 can be obtained by forming an inorganic film including an inorganic material such as silicon oxide or silicon nitride on the second insulating layer 327, forming an opening in the inorganic film in the light emitting region 300 to expose the pixel electrode 325, and further forming an opening for exposing the wiring 205 on the bottom of the contact hole 328.

Figure 9:
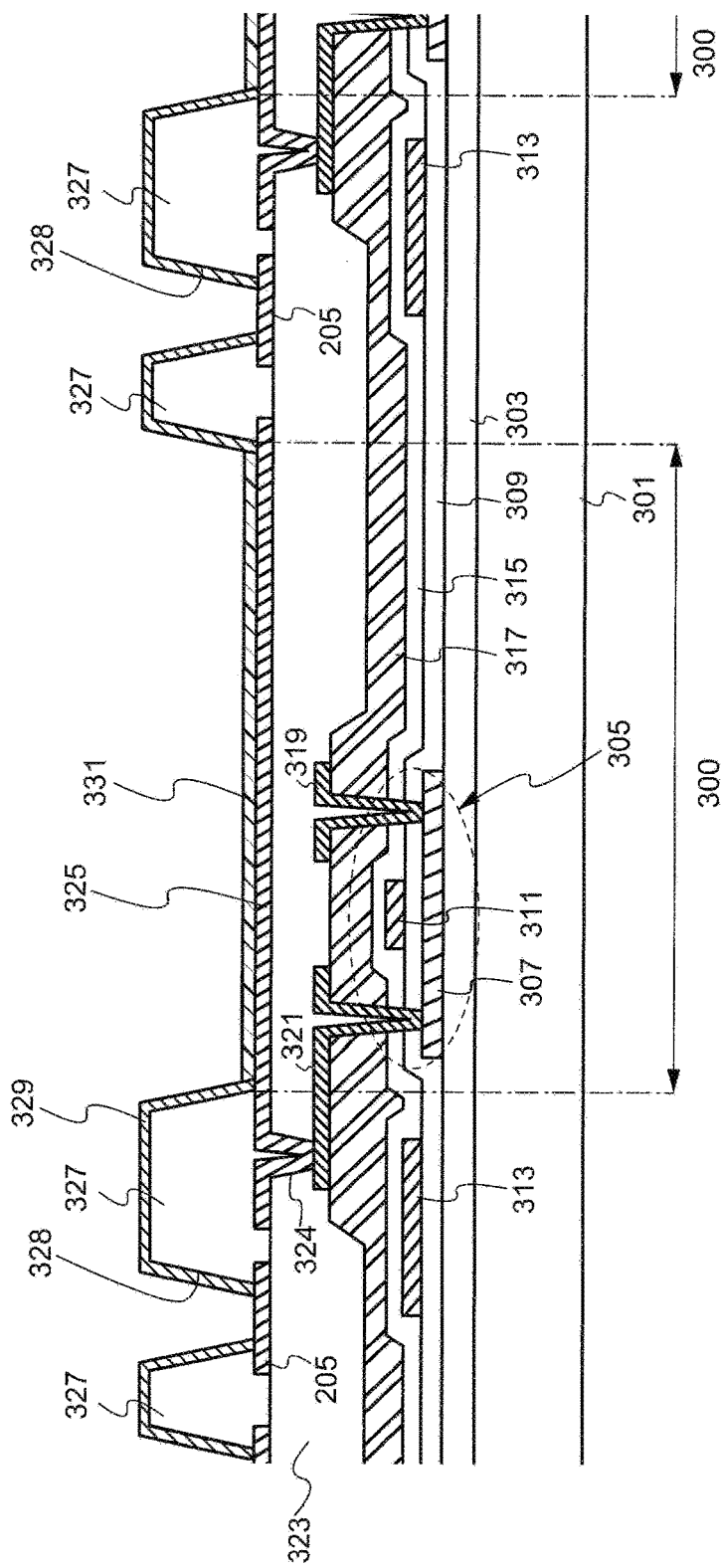
FIG. 9 is a diagram for illustrating processes for manufacturing the organic EL display device.

Then, an organic layer 331 is formed on the pixel electrode 325 in the light emitting region 300, as illustrated in FIG. 9. The organic layer 315 can be formed by a known method. For example, a low-molecular organic EL material may be formed by evaporation, or a high-molecular organic EL material may be formed by an inkjet method or the like.

Figure 10:
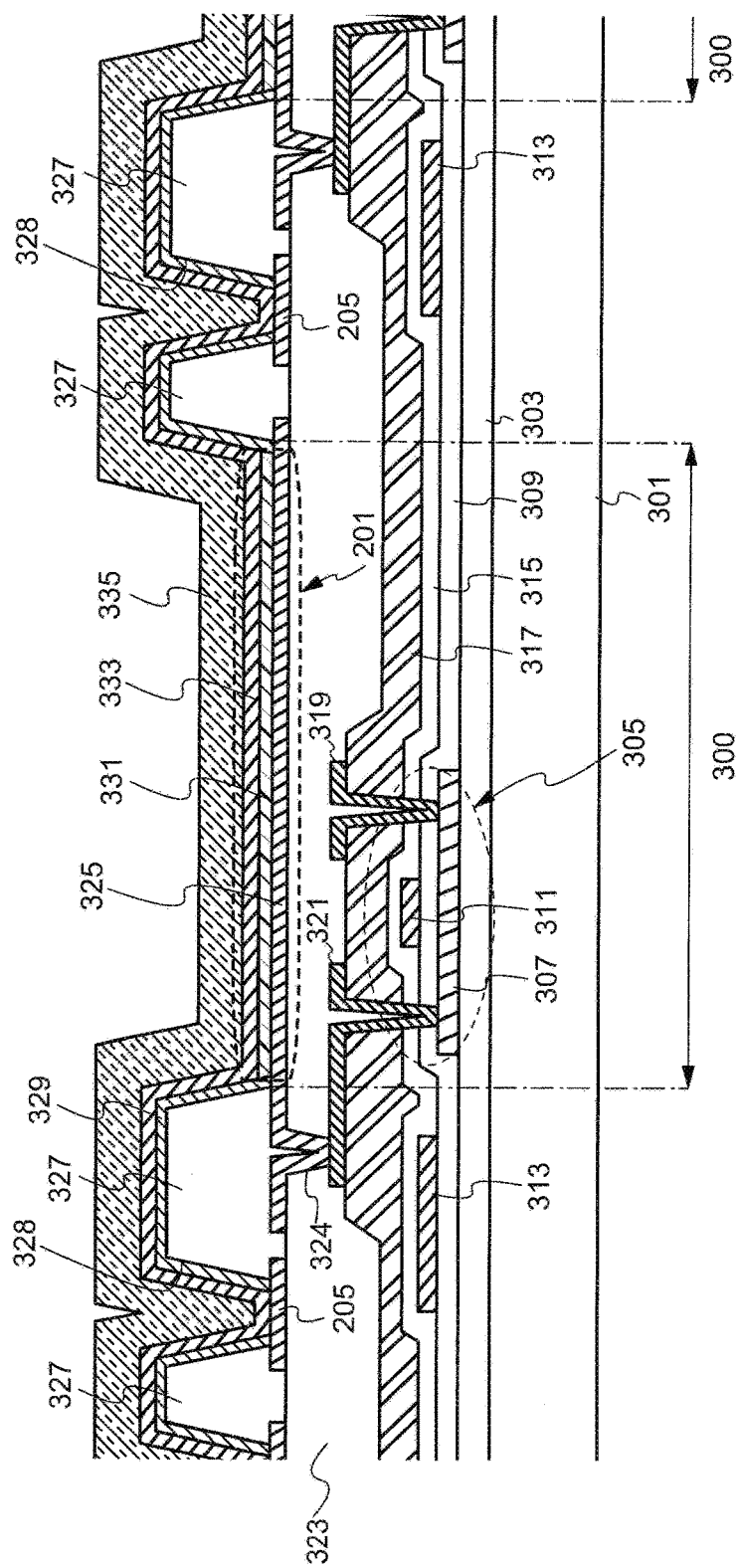
FIG. 10 is a diagram for illustrating processes for manufacturing the organic EL display device.

Then, as illustrated in FIG. 10, an opposite electrode 333 functioning as a cathode of the light emitting element 201 is formed, as illustrated in FIG. 10. In the present embodiment, the opposite electrode 333 is formed to be common among all pixels 110. The opposite electrode 333 uses an ITO film or an IZO film formed by a sputtering method. As a material for the opposite electrode 333, another transparent conductive film may be used, or a metal film formed as a film which is thin enough to transmit light may be used.

Then, a fourth insulating layer 335 including silicon nitride as a protective film is formed on the opposite electrode 333. At this time, the opposite electrode 333 and the fourth insulating layer 335 are desirably continuously formed without contacting the outside air.

Figure 11:
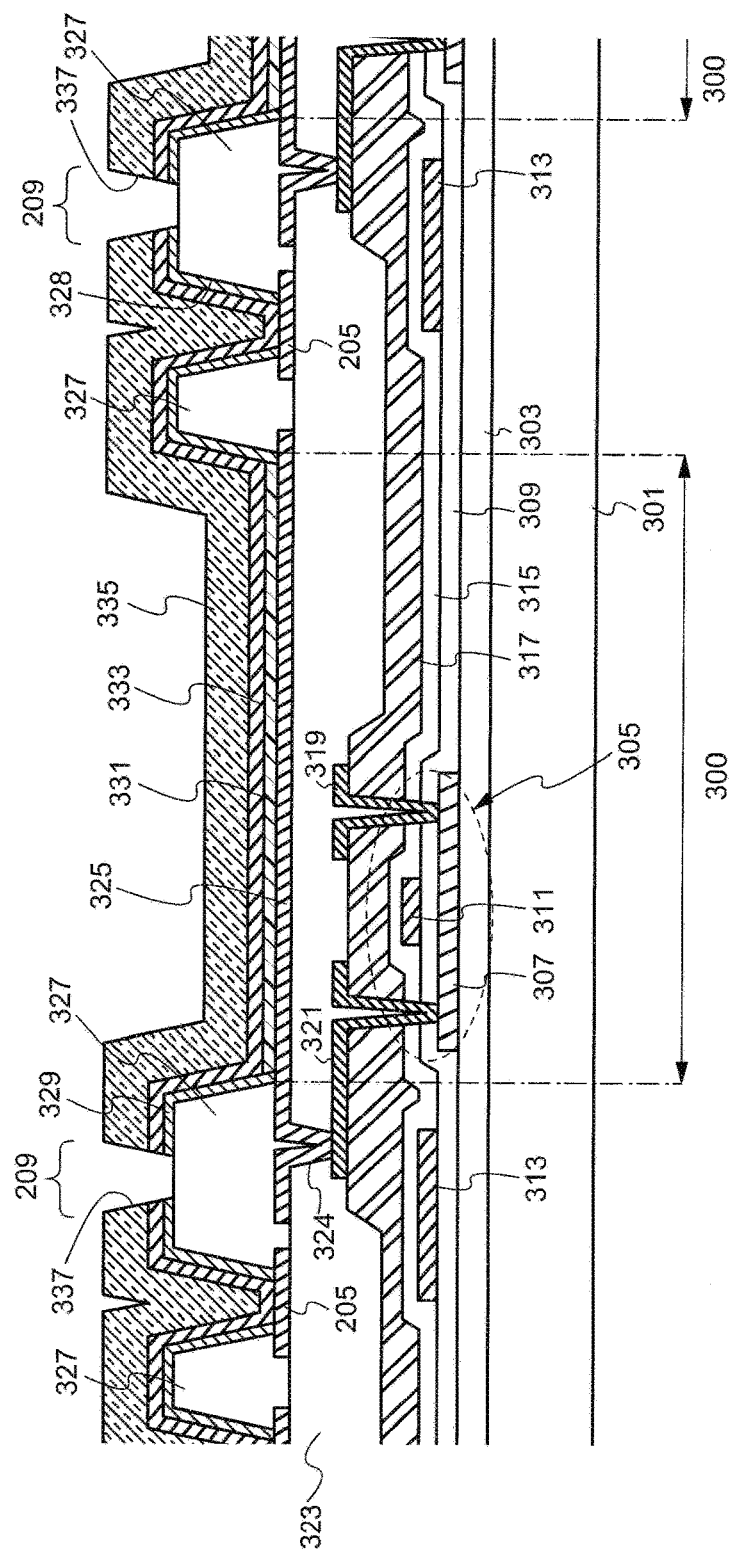
FIG. 11 is a diagram for illustrating processes for manufacturing the organic EL display device.

Then, as illustrated in FIG. 11, an opening 337 exposing the second insulating layer 327 is formed in the third insulating layer 329, the opposite electrode 333, and the fourth insulating layer 335 on the second insulating layer 327 functioning as a bank provided between the two adjacent pixel electrodes 325 for separating the adjacent light emitting regions 300. When the opening 337 is formed, a discontinuous region 209 in which the third insulating layer 329, the opposite electrode 333, and the fourth insulating layer 335 are respectively divided is formed.

As described above, an array substrate of the organic EL display device 100 according to the present embodiment is formed. Further, if the opposite substrate 341 illustrated in FIG. 3 is bonded to the array substrate using a filling material 339, the organic EL display device 100 illustrated in FIG. 3 can be obtained.

Second Embodiment

Figure 12:
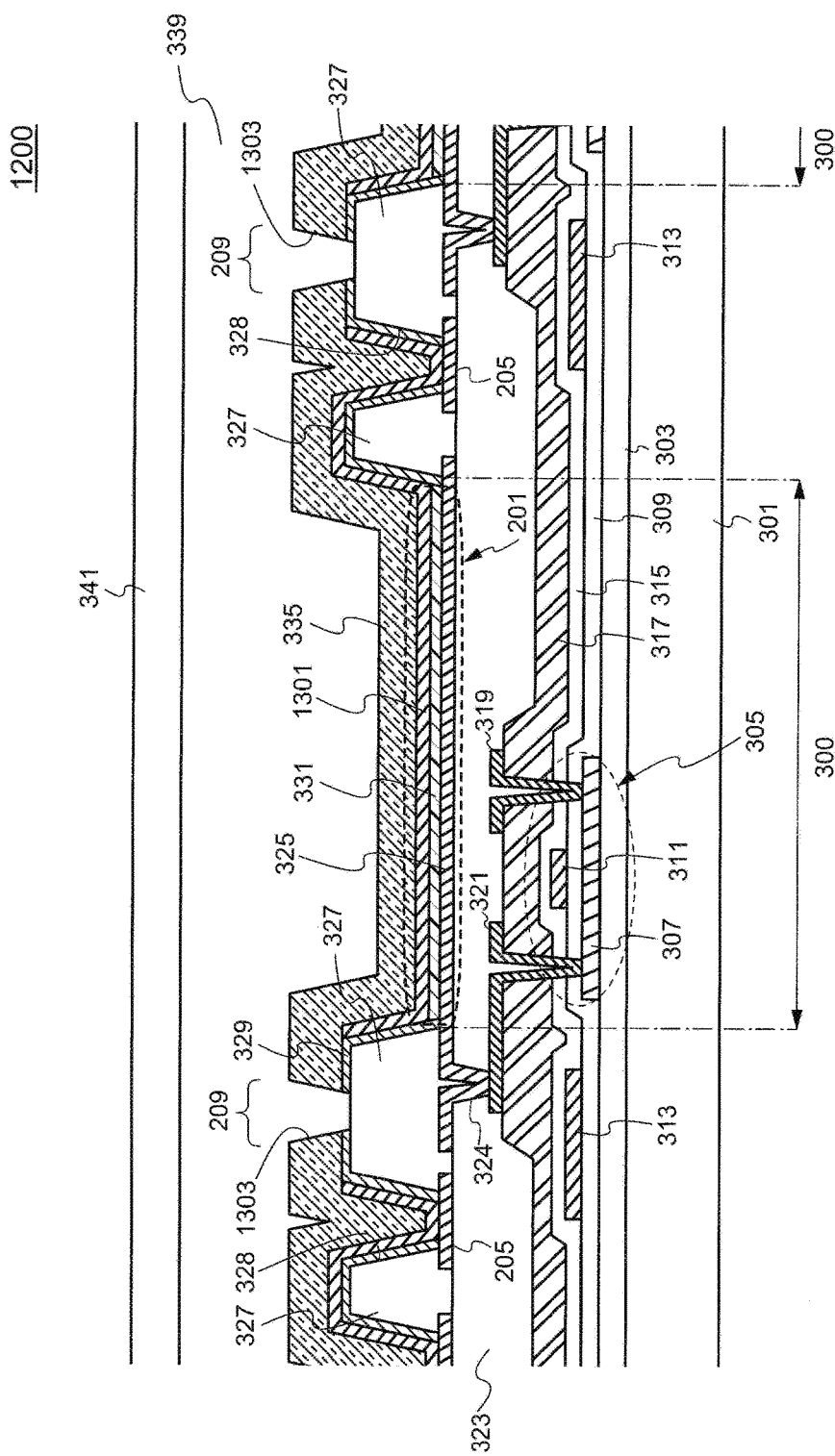
FIG. 12 is a cross-sectional view according to another example of a configuration of pixels in an organic EL display device.

FIG. 12 is a diagram illustrating a cross-sectional structure according to another example of a configuration of pixels in an organic EL display device 1200 according to a second embodiment. In the organic EL display device 1200 illustrated in FIG. 12, identical or similar components to those in each of the pixels in the organic EL display device 100 according to the first embodiment illustrated in FIG. 3 are assigned the same reference numbers as the reference numbers illustrated in FIG. 3, and hence detailed description is omitted.

The organic EL display device 1200 according to the second embodiment has a substantially identical configuration to that of the aforementioned organic EL display device 100 according to the first embodiment except for an opposite electrode 1301 provided on an organic layer 331 and a second insulating layer 327.

In the organic EL display device 1200, the opposite electrode 1301 is covered with a fourth insulating layer 335. That is, an end of the opposite electrode 1301 is not exposed to a discontinuous region 209 in a display region 102. In the organic EL display device 1200 according to the present embodiment, an opening 1303 is provided in the third insulating layer 329 and the fourth insulating layer 335 between two adjacent light emitting regions 300. More specifically, as illustrated in FIG. 12, the third insulating layer 329 and the fourth insulating layer 335 are provided with the opening 1303 on a second insulating layer 327 functioning as a bank for separating the two adjacent light emitting regions 300, i.e., adjacent pixel electrodes 325. The second insulating layer 327 is exposed by the opening 1303 provided in the third insulating layer 329 and the fourth insulating layer 335. The opening 1303 corresponds to the discontinuous region 209 in which the third insulating layer 329 and the fourth insulating layer 335 are respectively divided. In the organic EL display device 1200 according to the present embodiment, an end of the opposite electrode 1301 is not exposed to a sidewall of the opening 1303, unlike in the aforementioned organic EL display device 100 according to the first embodiment. That is, the end of the opposite electrode 1301 is on the side closer to the light emitting region 300 than respective ends of the third insulating layer 329 and the fourth insulating layer 335. An end of the organic layer 331 provided in each of light emitting elements 201 is on the side closer to the light emitting region 300 than the end of the opposite electrode 1301.

In the present embodiment, the end of the opposite electrode 1301 is not exposed to the opening 1303, and is covered with the fourth insulating layer 335. Thus, the opposite electrode 1301 is not exposed to the outside air or external moisture, and thus can be prevented from deteriorating.

A manufacturing method of the organic EL display device 1200 according to the present embodiment is substantially the same as the aforementioned manufacturing method of the organic EL display device according to the first embodiment except for a patterning of the opposite electrode 1301.

(Manufacturing Method)

Processes of manufacturing an array substrate of the organic EL display device 1200 according to the present embodiment will be described below with reference to FIGS. 13 to 15. Description of the same manufacturing processes as the aforementioned manufacturing processes for the organic EL display device 100 according to the first embodiment is omitted.

Figure 13:
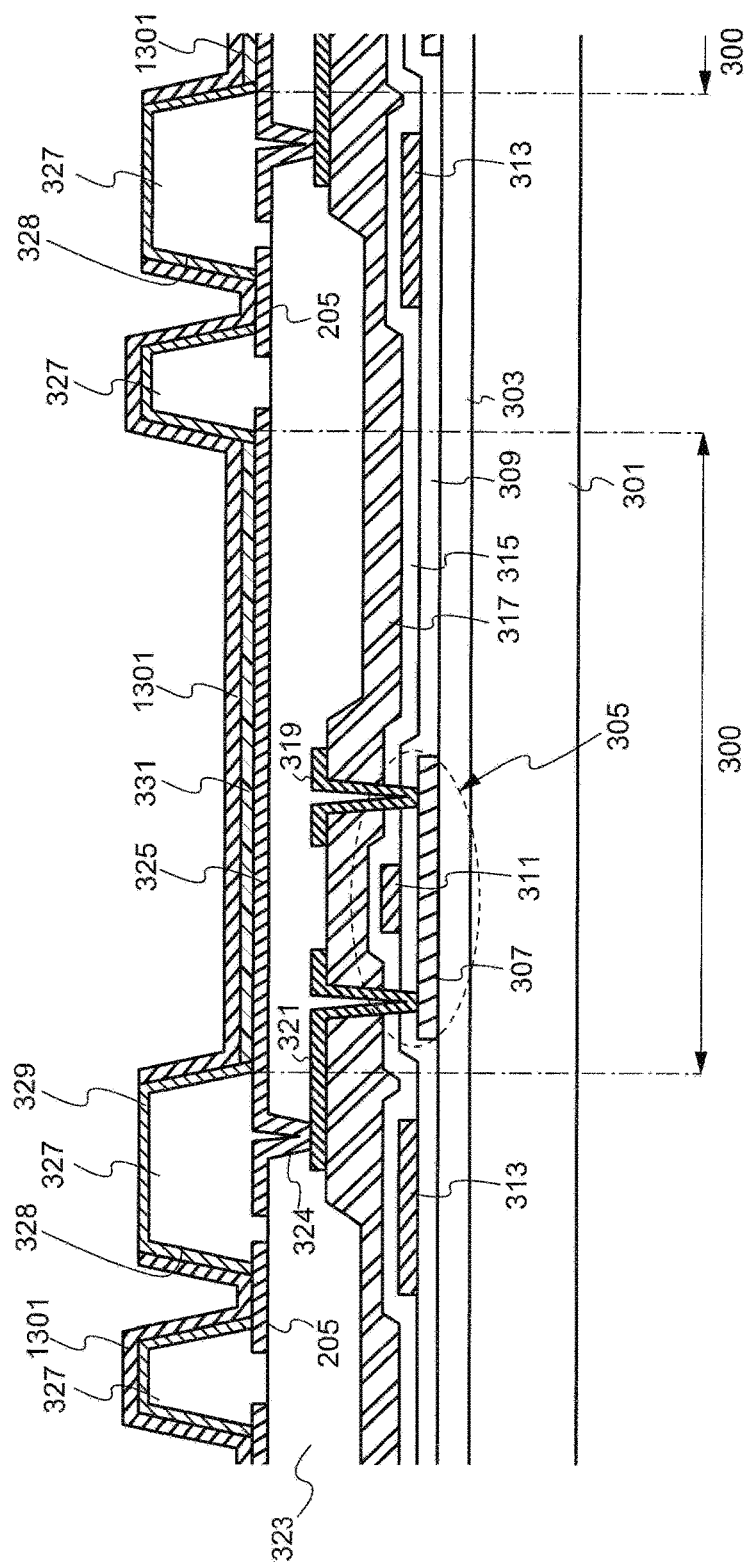
FIG. 13 is a diagram for illustrating processes for manufacturing the organic EL display device.

First, after an organic layer 331 is formed on a pixel electrode 325 in a light emitting region 300, as illustrated in FIG. 9, a patterned opposite electrode 1301 is formed, as illustrated in FIG. 13. The opposite electrode 1301 can be formed by evaporation using a metal mask. A material used for the opposite electrode 1301 may be similar to that for the opposite electrode 333 in the aforementioned organic EL display device 100.

The opposite electrode 1301 may be formed by forming a conductive film to be common among all pixels 201 after forming the organic layer 331 on the pixel electrode 325 in the light emitting region 300, and patterning the formed conductive film using photolithography.

Figure 14:
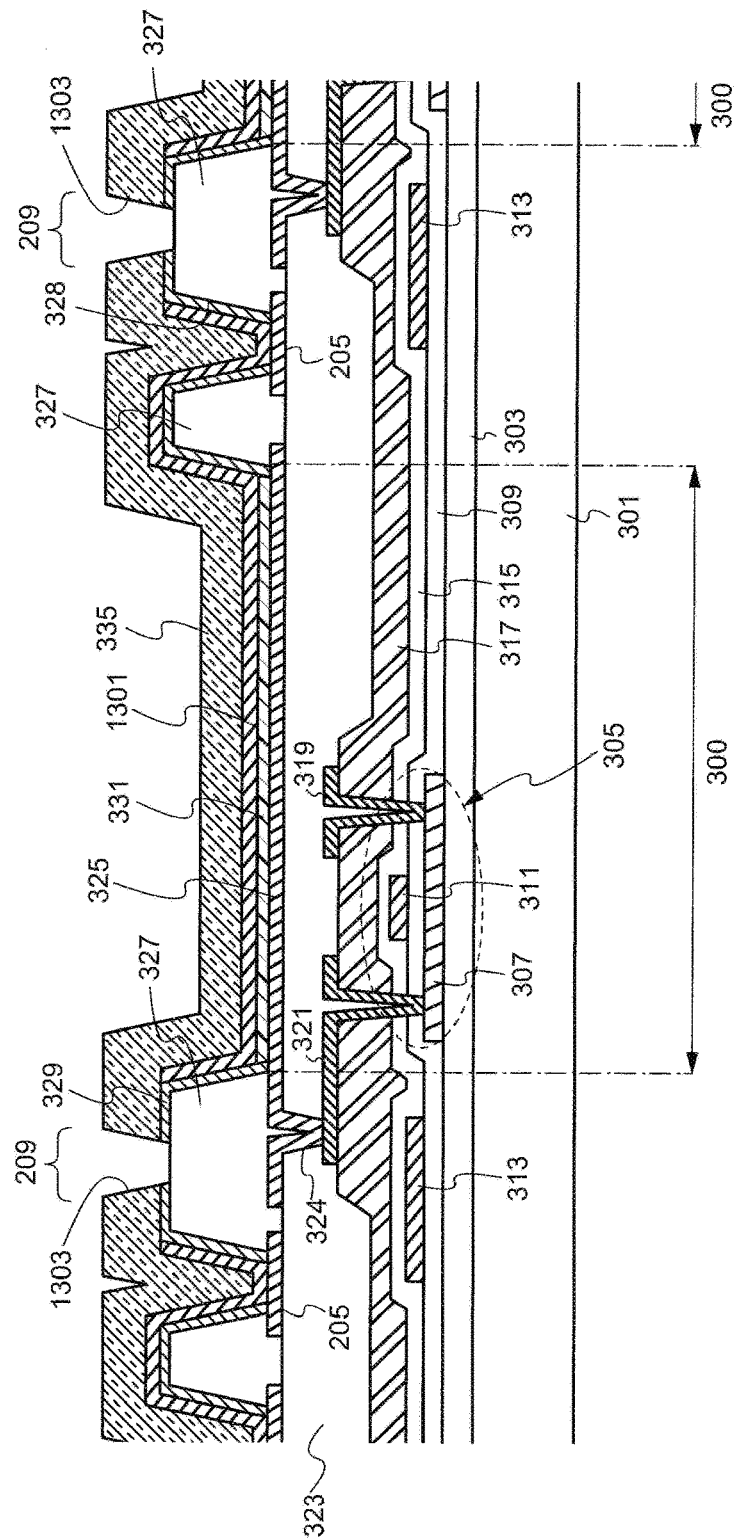
FIG. 14 is a diagram for illustrating processes for manufacturing the organic EL display device.

Then, as illustrated in FIG. 14, a fourth insulating layer 335 including silicon nitride as a protective film is formed on the opposite electrode 333. Then, an opening 1303 for exposing the second insulating layer 327 is formed in a third insulating layer 329 and the fourth insulating layer 335 on a second insulating layer 327 functioning as a bank for separating the two adjacent light emitting regions 300, i.e., the adjacent pixel electrodes 325. When the opening 1303 is formed, a discontinuous region 209 in which the third insulating layer 329 and the fourth insulating layer 335 are respectively divided is formed.

Third Embodiment

In each of the aforementioned organic EL display devices 100 and 1200 according to the first embodiment and the second embodiment of the present invention, the discontinuous region 209 in which the third insulating layer (second organic insulating layer) 331, the opposite electrodes 333 or 1301, and the fourth insulating layer (first inorganic insulating layer) 335 are respectively divided is provided to surround the one light emitting element 201 in a planar view in the display region 102. However, a position of the discontinuous region 209 is not limited to this. The discontinuous region 209 may be provided to surround at least one of the light emitting elements 201 in a planar view.

Figure 15:
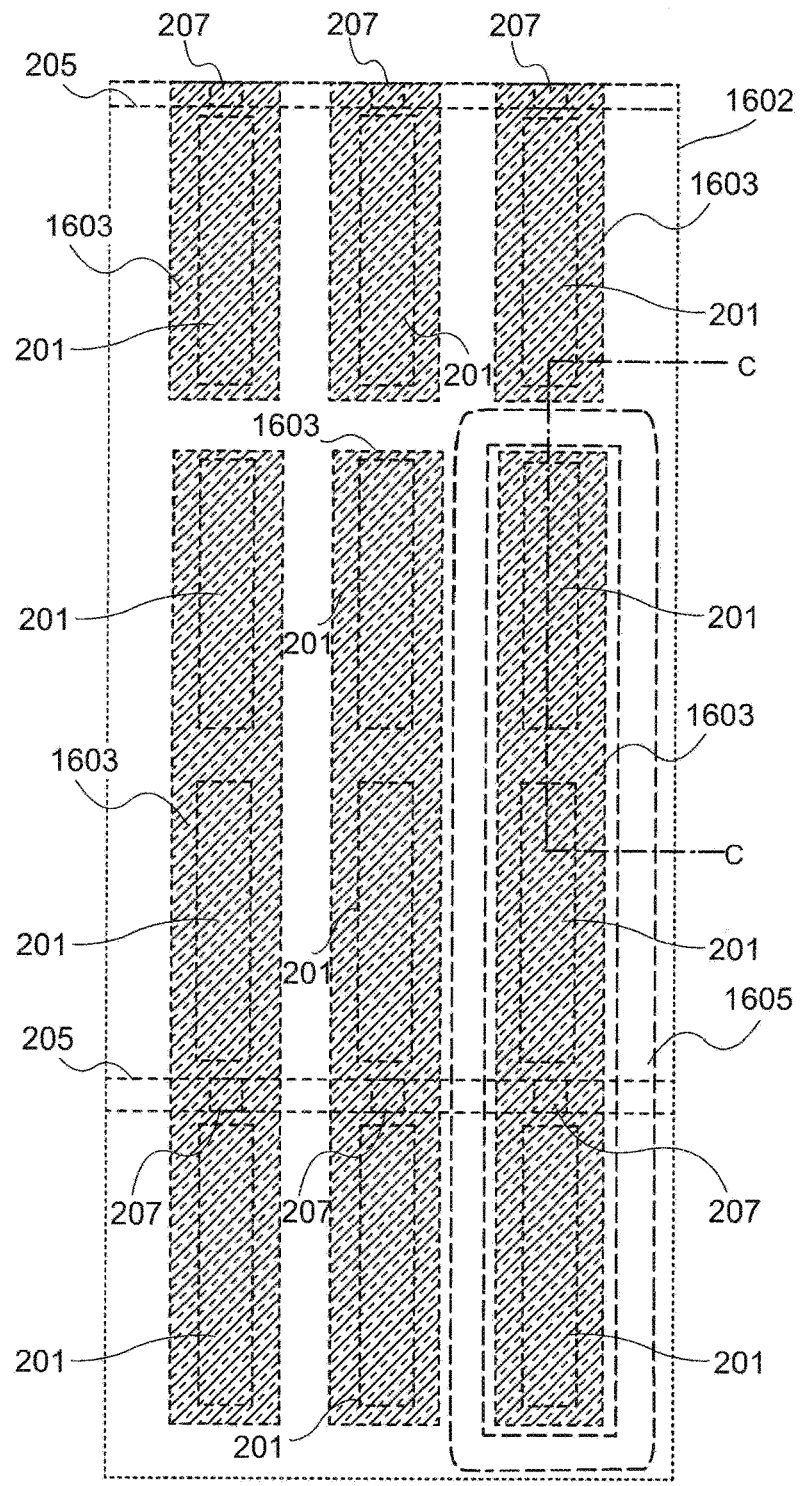
FIG. 15 is a diagram illustrating an example of a configuration of a display region in an organic EL display device.

FIG. 15 is a diagram illustrating a configuration of a display region 1602 of an organic EL display device 1600 according to a third embodiment of the present invention. More specifically, FIG. 15 illustrates a configuration in which twelve light emitting elements 201 are provided in a part of the display region 1602 in a planar view. A schematic configuration in a case where the organic EL display device 1600 is viewed in a planar view is identical to the schematic configuration in a case where the organic EL display device 100 illustrated in FIG. 1 is viewed in a planar view, and hence description thereof is omitted. In FIG. 15, identical or similar components to the components in the display region 102 in the organic EL display device 100 according to the first embodiment illustrated in FIG. 2 are assigned the same reference numbers as the reference numbers illustrated in FIG. 2. In description of the organic EL display device 1600 according to the present embodiment, described below, detailed description of identical or similar components to the components in the aforementioned organic EL display device 100 according to the first embodiment is omitted.

As illustrated in FIG. 15, in the display region 1602, an insulating layer (first inorganic insulating layer) 1603 covers the three light emitting elements 201 which are continuous in one column among the light emitting elements 201 respectively corresponding to pixels arranged in a stripe shape. That is, in the present embodiment, a discontinuous region 1605 in which at least an opposite electrode and the insulating layer 1603 are respectively divided is provided to surround the three light emitting elements 201 which are continuous in one column in a planar view. Therefore, in the three light emitting elements 201 which are continuous in one column, the opposite electrode can be made common thereamong in a planar view, and a connection section 207 between the opposite electrode and a wiring 205 is provided inside the discontinuous region 1605 in which at least the opposite electrode and the insulating layer 1603 are respectively divided in a planar view. While the insulating layer (first inorganic insulating layer) 1603 covers the three light emitting elements 201 which are continuous in one column among the light emitting elements 201 in FIG. 15, the number of the light emitting elements 201 covered by the insulating layer (first inorganic insulating layer) 1603 is not limited to three.

Figure 16:
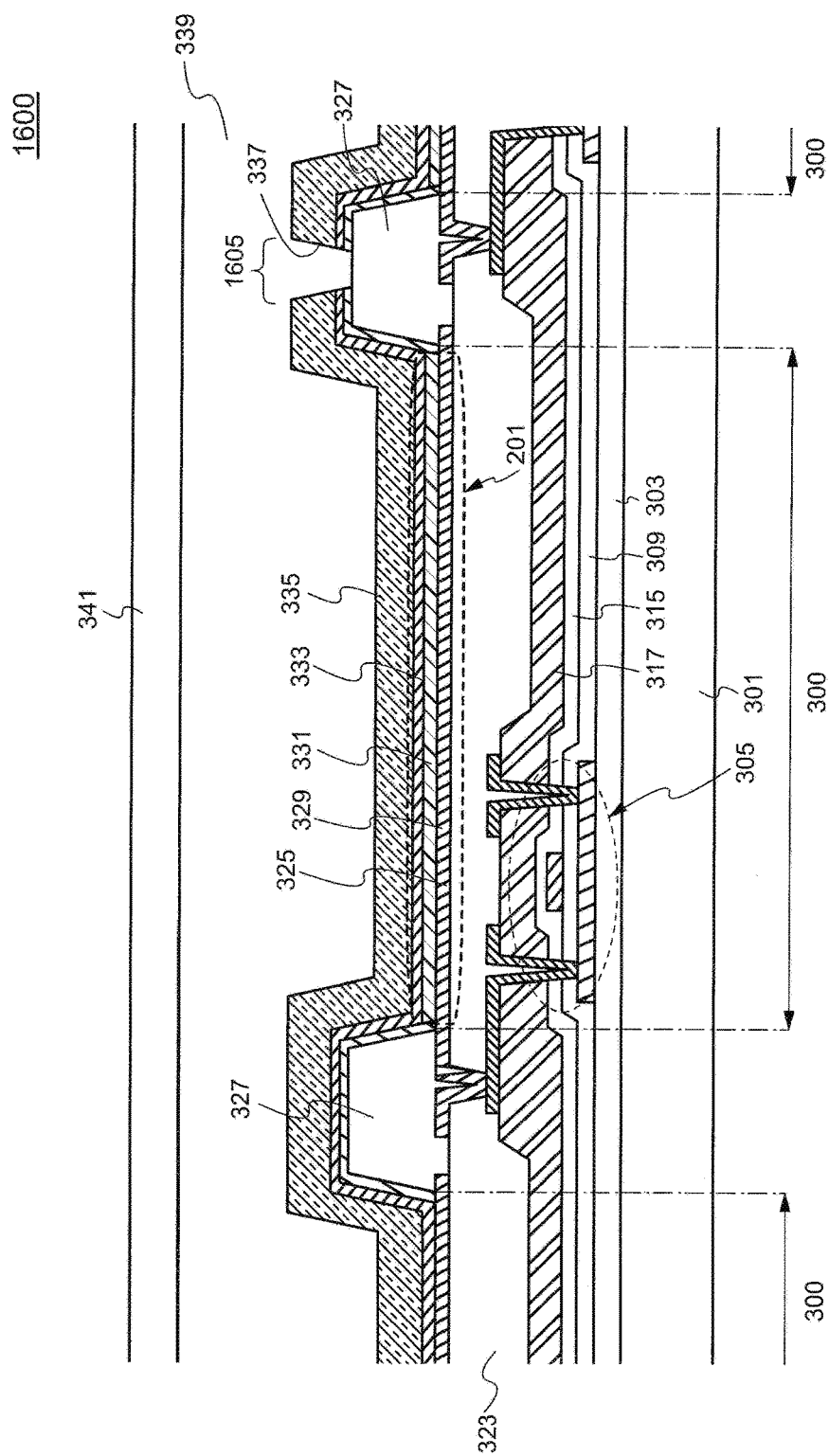
FIG. 16 is a cross-sectional view taken along a line C-C in FIG. 15.

FIG. 16 is a diagram illustrating an example of a configuration of pixels in the organic EL display device 1600 according to the third embodiment. More specifically, FIG. 16 illustrates a configuration of a cross section, cut along a line C-C, of the display region 1602 illustrated in FIG. 15. In FIG. 16, identical or similar components to the components in each of the pixels in the organic EL display device 100 according to the first embodiment illustrated in FIG. 3 are assigned the same reference numbers as the reference numbers illustrated in FIG. 3. As illustrated in FIG. 16, a configuration of the array substrate of the organic EL display device 1600 according to the third embodiment is substantially similar to the configuration of the array substrate of the organic EL display device 100 according to the first embodiment except for a position of the discontinuous region 1605 in which a third insulating region 329, an opposite electrode 333, and a fourth insulating layer 335 are respectively divided. Therefore, a description of the organic EL display device 1600 according to the third embodiment is omitted.

Figure 17:
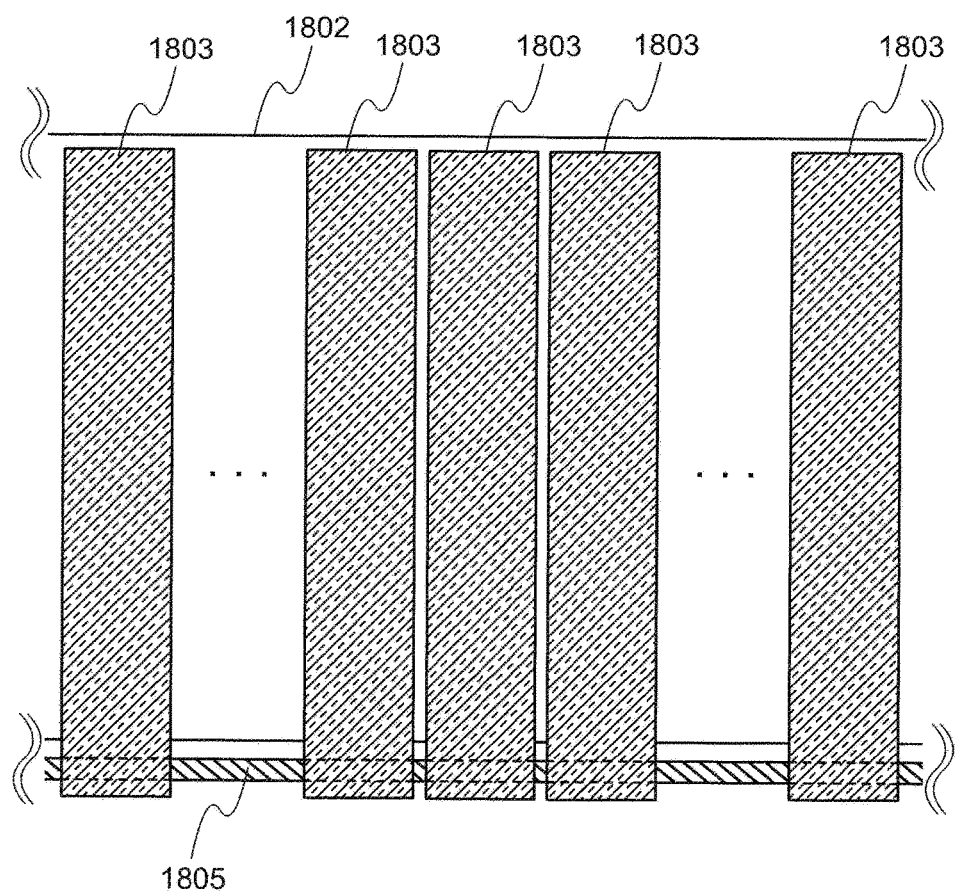
FIG. 17 is a diagram illustrating an example of a configuration of a display region in an organic EL display device.
Figure 18:
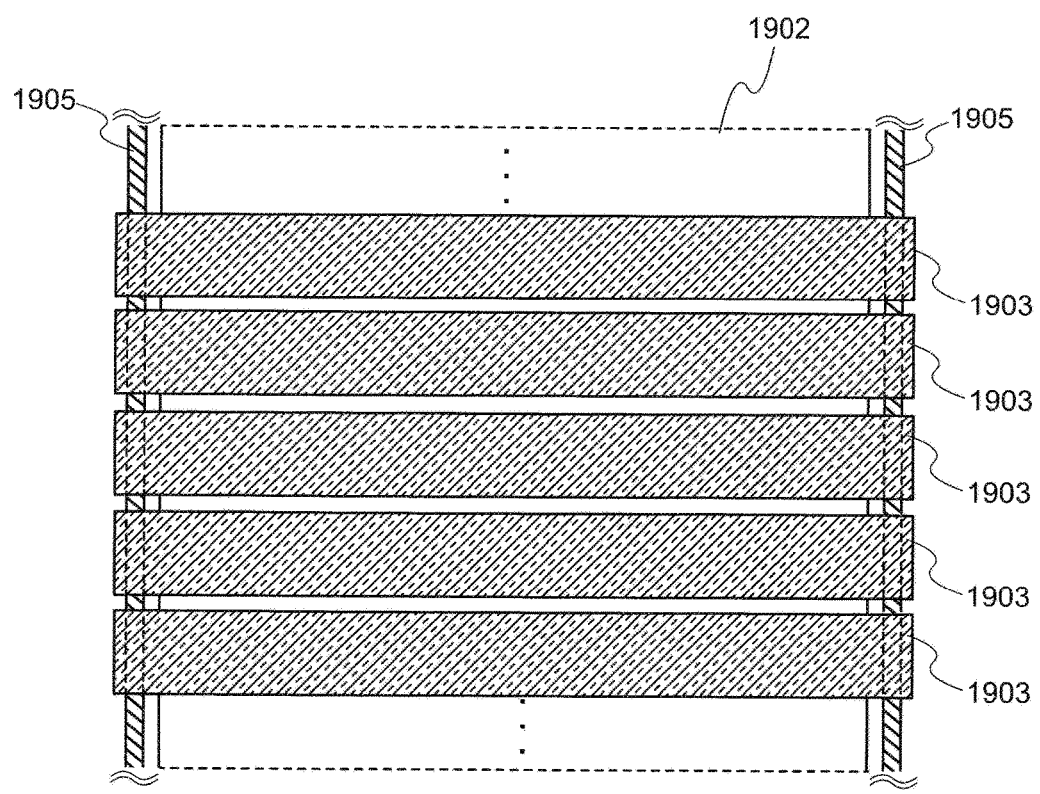
FIG. 18 is a diagram illustrating an example of a configuration of a display region in an organic EL display device.
Figure 19:
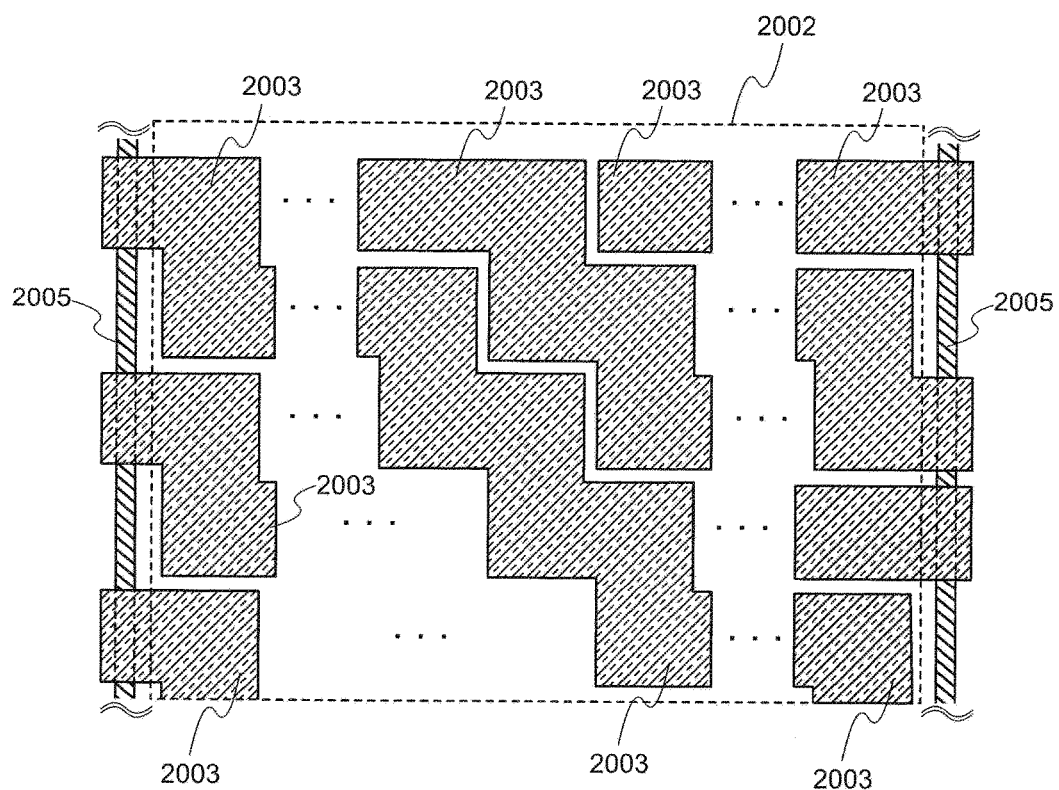
FIG. 19 is a diagram illustrating an example of a configuration of a display region in an organic EL display device.

A position of a discontinuous region in which at least an opposite electrode and a fourth insulating layer are respectively divided is not limited to the position of the discontinuous region in which at least the opposite electrode and the fourth insulating layer are respectively divided in each of the first to third embodiments described above. FIGS. 17 to 19 are diagrams each obtained by viewing a part of a display region of an organic EL display device according to another embodiment of the present invention in a planar view. In the display region illustrated in each of FIGS. 17 to 19, pixels are arranged in a stripe shape, like the pixels 110 illustrated in FIG. 1.

For example, as illustrated in FIGS. 17 and 18, in the display regions 1802 and 1902, fourth insulating layers 1803 and 1903 and opposite electrodes (not illustrated) respectively provided in layers below the fourth insulating layers 1803 and 1903 may be respectively provided to be common among the pixels positioned at one ends of the display regions 1802 and 1902 to the pixels positioned at the other ends thereof. Discontinuous regions in which at least the opposite electrodes and the fourth insulating layers 1803 and 1903 are respectively divided are respectively provided between the adjacent fourth insulating layers 1803 in FIG. 17 and between the adjacent fourth insulating layers 1903 in FIG. 18. In this case, wirings 1805 and 1905 for supplying voltages at a predetermined potential to the opposite electrodes are respectively provided outside the display regions 1802 and 1902. While the wirings 1905 are respectively provided at two adjacent sites at both ends of the display region 1902 in FIG. 18, the wiring 1905 may be provided at a site adjacent to one end of the display region 1902.

For example, as illustrated in FIG. 19, a fourth insulating layer 2003 and an opposite electrode (not illustrated) provided in a layer below the fourth insulating layer 2003 may be provided to have a stepped shape in a planar view in a display region 2002. A discontinuous region in which at least the opposite electrode and the fourth insulating layer 2003 are respectively divided is provided between adjacent fourth insulating layers 2003 in FIG. 19. In this case, a wiring 2005 for supplying a voltage at a predetermined potential to the opposite electrode is provided outside the display region 2002.

While addition, deletion, or design change of a component or components or addition, deletion, or condition change of a process or processes performed, as needed, by those skilled in the art based on the organic EL display device described as the embodiment of the present invention is also included in the scope of the present invention without departing from the spirit of the invention. The aforementioned embodiments can be mutually combined unless technical contradiction occurs.

Another function and effect different from the functions and effects produced by the aforementioned embodiments are naturally construed as being produced from the present invention if they are evident from the description of the present specification or easily predictable by those skilled in the art.

The invention claimed is:

1. A display device comprising:
a display region having a plurality of pixels, each of the plurality of pixels including a pixel electrode formed on an insulating surface, the plurality of pixels being arranged in a matrix shape;
a wiring layer between two adjacent pixel electrodes;
a bank covering an end of the pixel electrode and an end of the wiring layer;
an organic layer including a light emitting layer covering respective light emitting regions on the pixel electrodes;
an opposite electrode on the organic layer and the bank; and
a first inorganic insulating layer on the opposite electrode, wherein
each of the opposite electrode and the first inorganic insulating layer has a discontinuous region between the two adjacent light emitting regions,
the discontinuous region exposes a part of the bank, and
the opposite electrode is in contact with the wiring layer at a region which is separated from the discontinuous region.

2. The display device according to claim 1, wherein
the discontinuous region surrounds the light emitting region in a planar view.

3. The display device according to claim 1, wherein
the display device includes a plurality of discontinuous regions, and
an end of the organic layer is between adjacent two of the plurality of discontinuous regions in the display region.

4. The display device according to claim 1, further comprising
a second inorganic insulating layer on the bank, wherein
the second inorganic insulating layer is divided in a region overlapping the discontinuous region.

5. The display device according to claim 3, further comprising
a second inorganic insulating layer on the bank, wherein
the second inorganic insulating layer is divided in a region overlapping the discontinuous region,
an end of the opposite electrode is on the side closer to the light emitting region than an end of the second inorganic insulating layer in the display region, and
the end of the organic layer is on the side closer to the light emitting region than the end of the second inorganic insulating layer in the display region.

6. The display device according to claim 1, wherein
the insulating surface is on a resin substrate having flexibility.

* * * * *